(12) United States Patent
Chou

(10) Patent No.: US 8,018,139 B2
(45) Date of Patent: Sep. 13, 2011

(54) LIGHT SOURCE AND METHOD OF CONTROLLING LIGHT SPECTRUM OF AN LED LIGHT ENGINE

(75) Inventor: Der Jeou Chou, Mesa, AZ (US)

(73) Assignee: Enertron, Inc., Tempe, AZ (US)

( * ) Notice: Subject to any disclaimer, the term of this patent is extended or adjusted under 35 U.S.C. 154(b) by 365 days.

(21) Appl. No.: 12/264,723

(22) Filed: Nov. 4, 2008

(65) Prior Publication Data
US 2009/0114932 A1    May 7, 2009

Related U.S. Application Data

(60) Provisional application No. 60/985,541, filed on Nov. 5, 2007.

(51) Int. Cl.
*H01L 33/00* (2010.01)
(52) U.S. Cl. .............. 313/503; 362/249.02; 257/89; 257/98
(58) Field of Classification Search .............. 313/486, 313/503; 362/249.01–249.02; 257/89–100
See application file for complete search history.

(56) References Cited

U.S. PATENT DOCUMENTS

| | | | |
|---|---|---|---|
| 5,998,925 A | 12/1999 | Shimizu et al. | |
| 6,069,440 A * | 5/2000 | Shimizu et al. | 313/486 |
| 6,245,259 B1 | 6/2001 | Hohn et al. | |
| 6,252,254 B1 | 6/2001 | Soules et al. | |
| 6,429,583 B1 | 8/2002 | Levinson et al. | |
| 6,576,930 B2 | 6/2003 | Reeh et al. | |
| 6,600,175 B1 | 7/2003 | Baretz et al. | |
| 6,632,379 B2 | 10/2003 | Mitomo et al. | |
| 6,649,946 B2 | 11/2003 | Bogner et al. | |
| 6,669,866 B1 | 12/2003 | Kummer et al. | |
| 6,809,347 B2 | 10/2004 | Tasch et al. | |
| 6,943,380 B2 | 9/2005 | Ota et al. | |
| 7,078,732 B1 | 7/2006 | Reeh et al. | |
| 7,213,940 B1 | 5/2007 | Van De Ven et al. | |
| 2004/0212295 A1 * | 10/2004 | Yin Chua et al. | 313/503 |
| 2006/0239002 A1 * | 10/2006 | Chou et al. | 362/249 |

FOREIGN PATENT DOCUMENTS
WO    02/11214 A1    2/2002

* cited by examiner

*Primary Examiner* — Nimeshkumar Patel
*Assistant Examiner* — Mary Ellen Bowman
(74) *Attorney, Agent, or Firm* — Robert D. Atkins; Patent Law Group

(57) ABSTRACT

A light emitting diode (LED) light engine includes a substrate for supporting the LED light engine. Conductive traces are formed over the substrate using a thick film screen printing, physical vapor deposition, chemical vapor deposition, electrolytic plating, printed circuit board fabricating, or electroless plating process. The conductive traces include mounting pads. LEDs are mounted to each of the mounting pads for electrical interconnection. The LEDs include red LEDs, green LEDs and blue LEDs. Each of the blue LEDs is at least partially covered with a yellow phosphor coating compound. The concentration of the yellow phosphor coating compound is controlled to allow the emission of blue and yellow spectrum light energy from each blue LED. Emissions of light energy from the red LEDs, green LEDs and blue LEDs are combined to achieve a target correlated color temperature and a target color rendering index for the LED light engine.

35 Claims, 8 Drawing Sheets

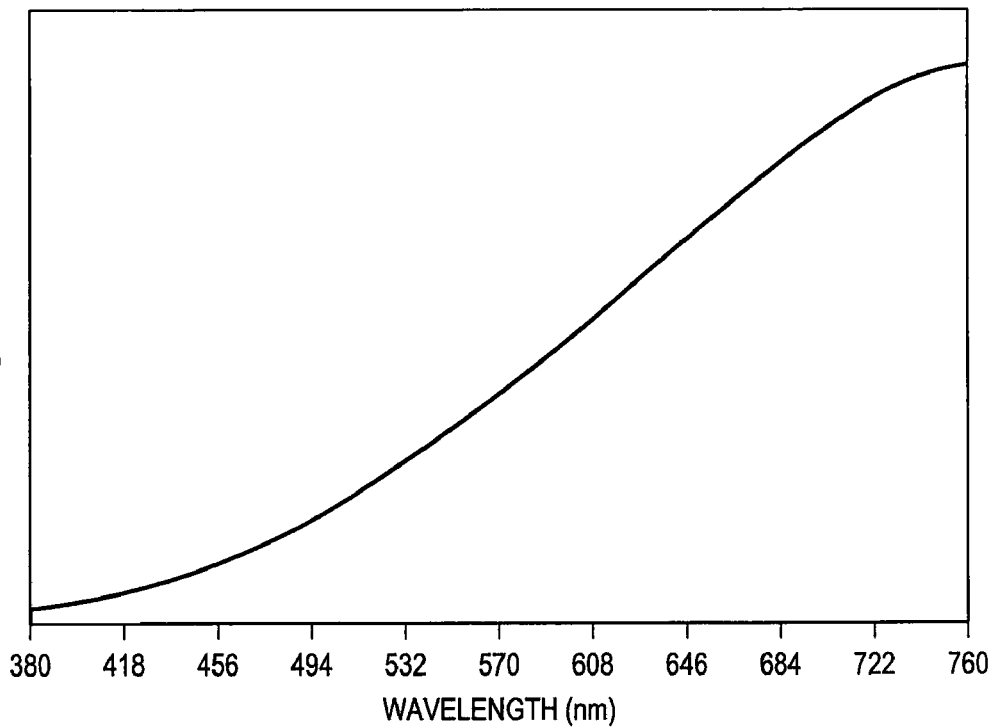
FIG. 1 THE SPECTRUM OF AN INCANDESCENT WHITE LIGHT SOURCE
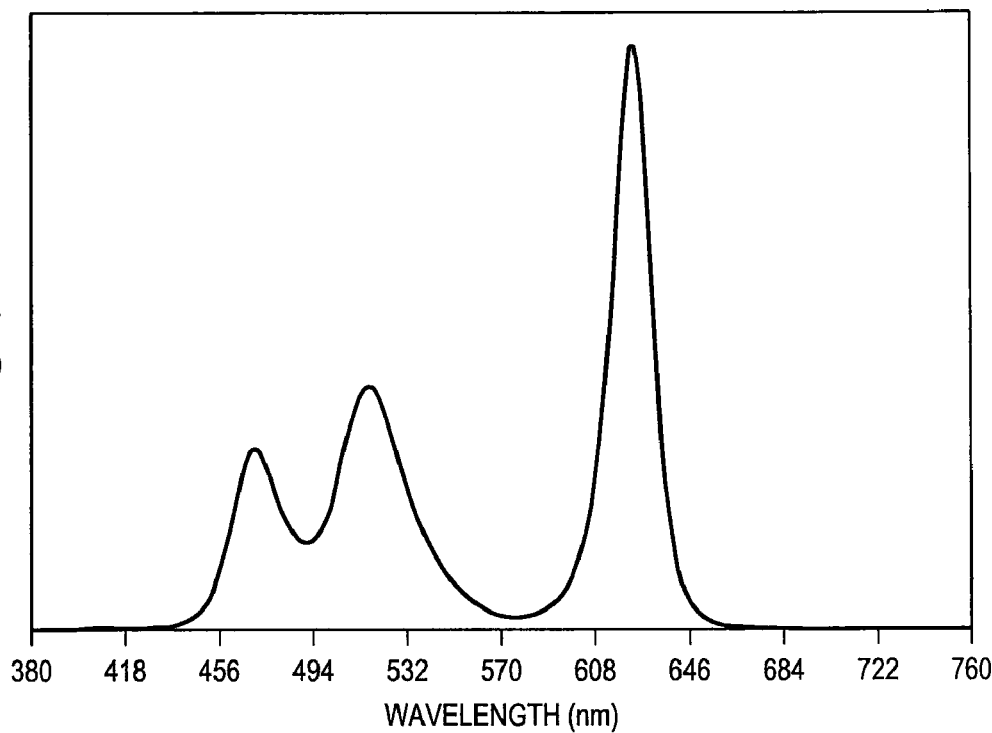
FIG. 2 THE SPECTRUM OF A WHITE RGB LED LIGHT ENGINE

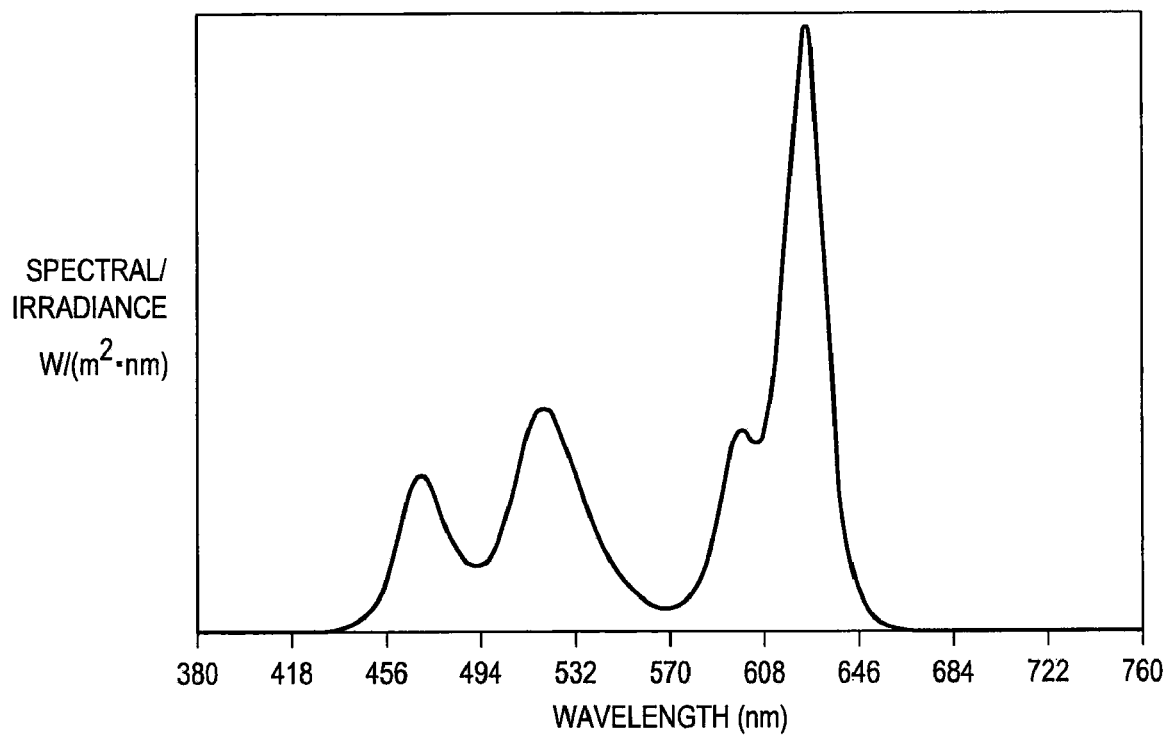
FIG. 3  THE SPECTRUM OF A WHITE RAGB LED LIGHT ENGINE
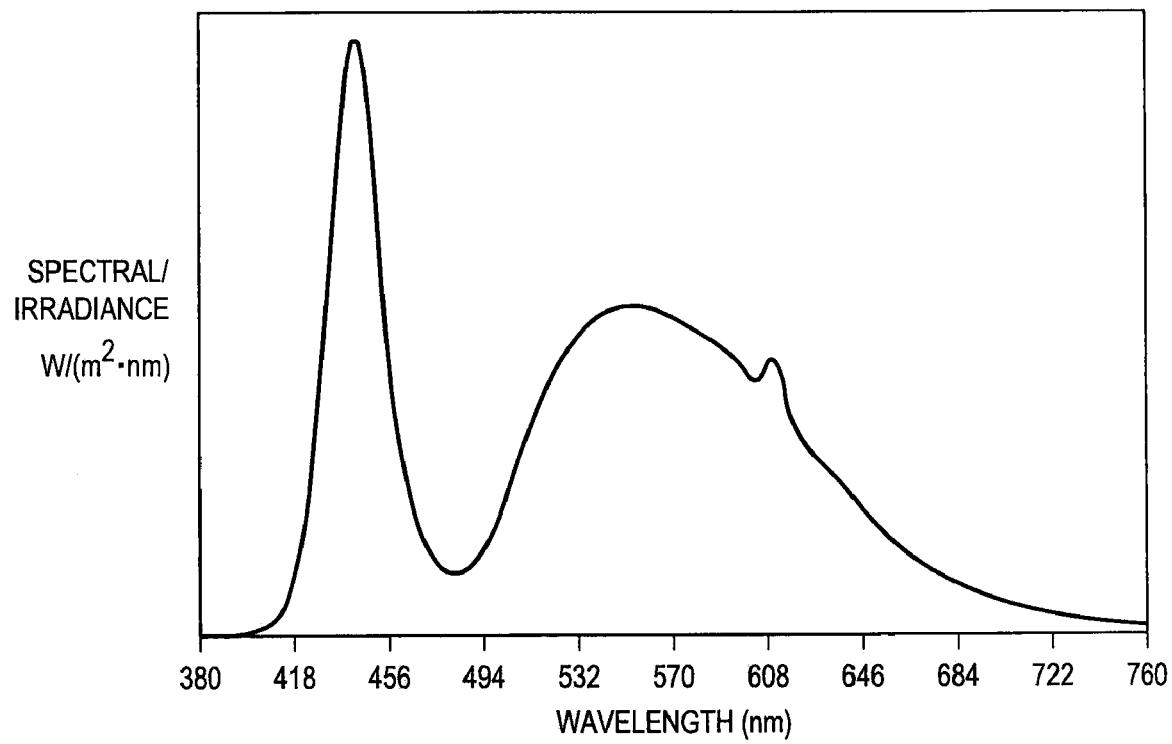
FIG. 4  THE SPECTRUM OF A WHITE BLUE PHOSPHOR LED LIGHT ENGINE FIG. 5
THE SPECTRUM OF A WHITE RED LED, GREEN LED, AND BLUE LED WITH PHOSPHOR LIGHT ENGINE
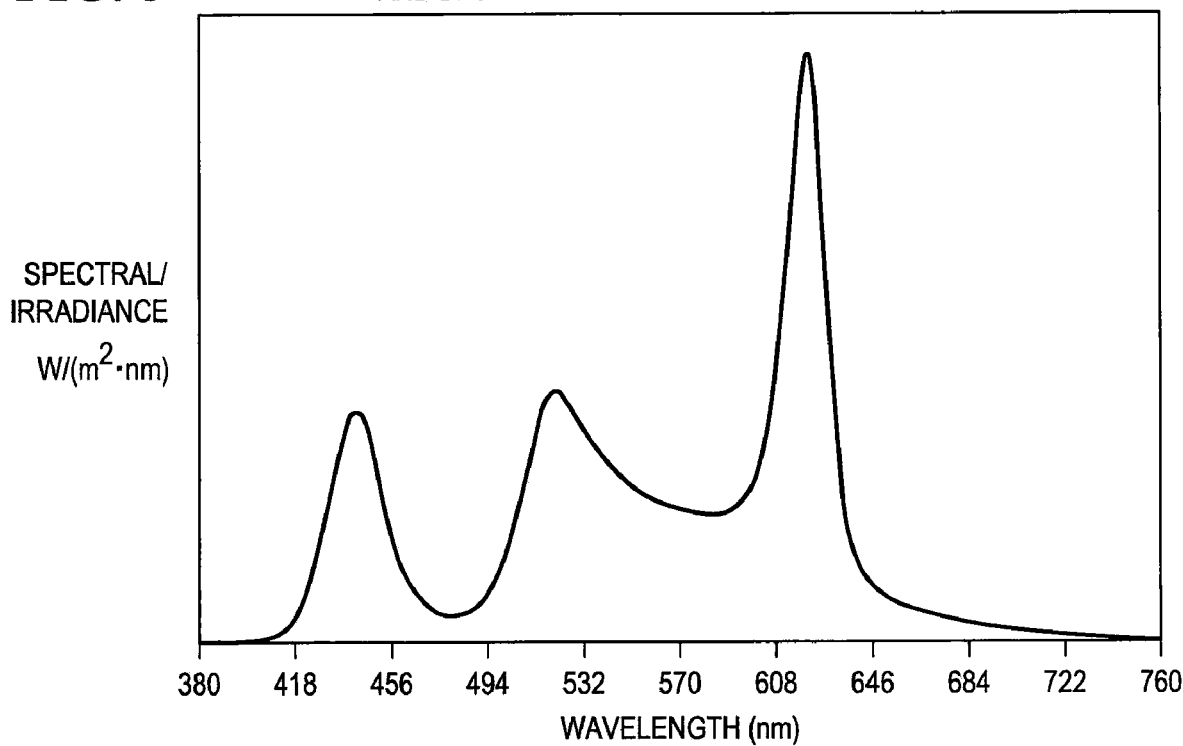
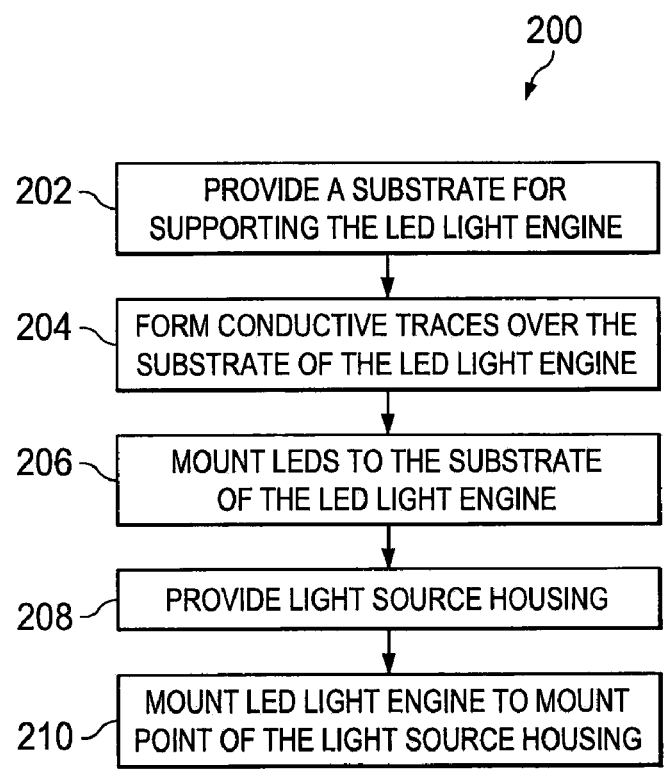
FIG. 10

US 8,018,139 B2

LIGHT SOURCE AND METHOD OF CONTROLLING LIGHT SPECTRUM OF AN LED LIGHT ENGINE

CLAIM OF DOMESTIC PRIORITY

The present non-provisional patent application claims priority to Provisional Application No. 60/985,541 entitled "Methods for Improving Color Rendering Index of an RGB LED Light Engine," filed on Nov. 5, 2007, and claims priority to the foregoing application pursuant to 35 U.S.C. §120.

FIELD OF THE INVENTION

The present invention relates in general to light emitting devices and, specifically, to a light emitting diode (LED) light engine having an improved color rendering index.

BACKGROUND OF THE INVENTION

Light emitting diodes (LEDs) have been used for decades in applications requiring relatively low-energy indicator lamps, numerical readouts, and the like. In recent years, however, the brightness and power of individual LEDs has increased substantially, resulting in the availability of 1 watt and 5 watt devices.

While small, LEDs exhibit a high efficacy and life expectancy as compared to traditional lighting products. A typical incandescent bulb has an efficacy of 10 to 12 lumens per watt, and lasts for about 1,000 to 2,000 hours; a general fluorescent bulb has an efficacy of 40 to 80 lumens per watt, and lasts for 10,000 to 20,000 hours; a typical halogen bulb has an efficacy of 20 lumens and lasts for 2,000 to 3,000 hours. In contrast, red-orange LEDs can emit 55 lumens per watt with a life-expectancy of about 100,000 hours.

When manufacturing LED light engines, it is important that the device outputs light energy having an appropriate color rendering index (CRI). The CRI of a light source provides an objective measure of how particular colors will look when illuminated by the light source. Unfortunately, because the CRI is only determined by reviewing how a small number of colors are illuminated, the metric is often a poor measure of perceived lighting quality. In fact, many illumination engineering societies around the world, as well as the US Department of Energy, recognize that a new CRI metric should be developed for correctly measuring a color rendering index of a light source. However, before such a new metric can be developed, the current CRI metric is still the standard for measuring the color rendering of light sources. Accordingly, in most commercial environments, it is necessary for a particular light source to provide a high CRI in order to be commercially competitive.

Using LEDs, it is difficult to manufacture light engines having commercially attractive CRIs. For example, in a light source having a red, green and blue (RGB) mixed LED light engine, it is difficult to generate a high CRI. Accordingly, even though the LED light engine may have attractive light-generation properties, it is assigned a low CRI that does not indicate the true color rendering or the true visual performance of the RGB LED light engine. The reason for the low CRI from a RGB mixed white light engine is the absence of the yellow spectrum having wavelengths of 560 nm to 580 nm. Unfortunately, both of the widely used semiconductor compounds AlGaInP and InGaN are not efficient when emitting light around the yellow spectrum. Although an amber 589 nm LED may be added to the RGB light engine to boost the CRI of the light engine around the yellow spectrum, the inefficiency of amber LEDs will reduce the overall lumen output of the LED light engine. For general illumination lighting devices this is not an attractive option because the LED light engine may be required to pass Energy Star V 1.0, which mandates the device efficacy exceed 35 lumens per watt, for example.

In application, the CRI is composed of 14 color charts: R1, R2, R3 to R14. All 14 color elements must be scored well in order to get a high CRI. This requires that all visible band spectrum from 400 nm to 700 nm be present in a white light. The incandescent white light spectrum, which is shown in FIG. 1 demonstrates the full visible band spectrum and a CRI score near 100. With reference to FIG. 1, an absence of 560 nm to 580 nm, as is found in most LED light engines, will jeopardize the CRI score.

SUMMARY OF THE INVENTION

In one embodiment, the present invention is a method of manufacturing a light emitting diode (LED) light engine comprising providing a substrate for supporting the LED light engine, and forming conductive traces over the substrate using a thick film screen printing, physical vapor deposition (PVD), chemical vapor deposition (CVD), electrolytic plating, printed circuit board fabricating, or electroless plating process. The conductive traces include mounting pads. The method includes mounting LEDs to each of the mounting pads to electrically interconnect each of the LEDs. The LEDs include red LEDs, green LEDs and blue LEDs. The method includes disposing a yellow phosphor coating compound over each of the blue LEDs to at least partially cover each of the blue LEDs. The concentration of the yellow phosphor coating compound is controlled to allow the emission of blue and yellow spectrum light energy from each blue LED. The method includes combining emissions of light energy from the red LEDs, green LEDs and blue LEDs to achieve a target correlated color temperature (CCT) and a target color rendering index (CRI) for the LED light engine.

In another embodiment, the present invention is a method of manufacturing a light emitting diode (LED) light engine comprising providing a substrate for supporting the LED light engine, and forming conductive traces over the substrate. The conductive traces including mounting pads. The method includes mounting LEDs to each of the mounting pads to electrically interconnect each of the LEDs. The LEDs include red LEDs, green LEDs and blue LEDs. The method includes covering at least one of the blue LEDs with a yellow phosphor coating compound. The concentration of the yellow phosphor coating compound is controlled to allow the emission of only yellow spectrum light energy from the at least one blue LED. The method includes combining emissions of light energy from the red LEDs, green LEDs and blue LEDs to achieve a target correlated color temperature (CCT) and a target color rendering index (CRI) for the LED light engine.

In another embodiment, the present invention is a method of manufacturing a light emitting diode (LED) light engine comprising providing a substrate for supporting the LED light engine, and mounting LEDs to the substrate. The LEDs are electrically interconnected. The LEDs include red LEDs and blue LEDs. Each of the blue LEDs is at least partially covered with a yellow phosphor coating compound. The concentration of the yellow phosphor coating compound is controlled to allow the emission of blue and yellow spectrum light energy from each blue LED. Emissions of light energy from the red LEDs and blue LEDs are combined to achieve a target correlated color temperature (CCT) and a target color rendering index (CRI) for the LED light engine.

In another embodiment, the present invention is a light emitting diode (LED) light engine comprising a substrate for supporting the LED light engine, and LEDs mounted to the substrate. The LEDs are electrically interconnected. The LEDs include red LEDs and blue LEDs. At least one of the blue LEDs is covered with a yellow phosphor coating compound. The concentration of the yellow phosphor coating compound is controlled to allow the emission of only yellow spectrum light energy from the at least one blue LED. Emissions of light energy from the red LEDs and blue LEDs are combined to achieve a target correlated color temperature (CCT) and a target color rendering index (CRI) for the LED light engine.

BRIEF DESCRIPTION OF THE DRAWINGS

FIG. 1 shows a graph illustrating the light output spectrum of an incandescent white light bulb over a range of wavelengths from approximately 380 nm to 760 nm;

FIG. 2 shows a graph illustrating the light output spectrum of a white light emitting diode (LED) light engine over a range of wavelengths from approximately 380 nm to 760 nm, the LED light engine includes red, green, and blue LEDs;

FIG. 3 shows a graph illustrating the light output spectrum of a white LED light engine over a range of wavelengths from approximately 380 nm to 760 nm, the LED light engine includes red, green, amber, and blue LEDs;

FIG. 4 shows a graph illustrating the light output spectrum of a white LED light engine over a range of wavelengths from approximately 380 nm to 760 nm, the LED light engine includes blue LEDs coated with yellow phosphor;

FIG. 5 shows a graph illustrating the light output spectrum of a white LED light engine over a range of wavelengths from approximately 380 nm to 760 nm, the LED light engine includes red, green and blue LEDs, the blue LEDs include a phosphor material;

FIG. 10 illustrates a method for manufacturing a light source including an LED light engine, the LED light engine having red LEDs, green LEDs, and blue LEDs covered with a phosphorous or phosphorescent coating compound.

DETAILED DESCRIPTION OF THE DRAWINGS

Figure 6A:
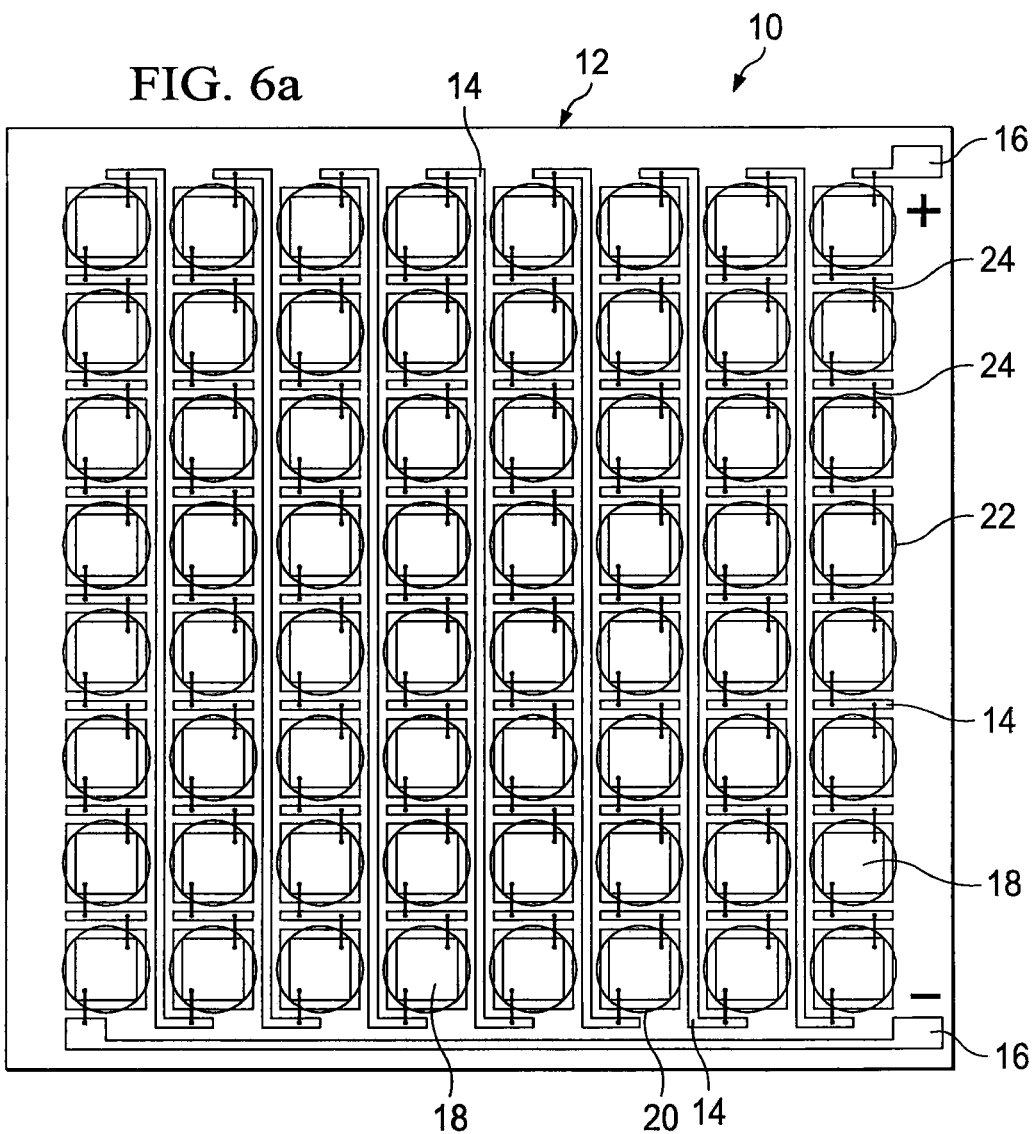
FIGS. 6a and 6b illustrate a substrate integrating a plurality of red LEDs, green LEDs, and blue LEDs, where the blue LEDs are covered with a phosphorous or phosphorescent coating compound, the LEDs are connected to the substrate with wirebonds and the LEDs are electrically interconnected in series.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

LED lighting sources provide a brilliant light in many settings. LED lights are efficient, long-lasting, cost-effective, and environmentally friendly. LED lighting is rapidly becoming the light source of choice in many applications.

LED light sources rely on LED light engines to generate the light energy that is emitted from the light source. In one embodiment, the LED light engine of an LED light source includes a plurality of LED devices mounted over a substrate. The LED devices are electrically interconnected and a power supply energizes the LED devices via connection terminals connected to the substrate. The plurality of interconnected LED devices generate substantial amounts of light energy. In some cases, the individual LED devices generate different colors of light, which ultimately mix together resulting in a single output color of the LED light source. Because the LED devices generate heat energy, the light source containing the LED light engine often includes a thermally efficient structure, such as a combination of heatsinks, to extract heat energy from the LED light engine. The light source may include an LED light engine mount point for mounting the LED light engine. The light engine mount point and the heatsink are in thermal communication.

When manufacturing LED light engines, it is important to control the CRI and color temperature of light spectrum generated by the engine. Both factors reflect the visual performance of the light source and may determine whether the light emitted by the device is pleasing to the eye. The CRI of a light source provides an objective measure of how particular colors will look when illuminated by the light source. The higher the CRI, the more accurate the color representation. If a device has a low CRI, colors illuminated by the device may appear to change to resemble other inaccurate colors. For example, a yellow color illuminated by a light source having a low CRI may turn to amber. The color temperature of the device indicates the hue of a particular light source. Depending upon the color temperature, the light source may appear to generate either 'warm' or 'cold' colors.

In many commercial applications, it is necessary to provide light sources having a relatively high CRI. A high CRI indicates that the light source is capable of accurately reproducing colors. A device having a high CRI of 100, for example, resembles a natural or ideal light source. A high CRI is often attractive for consumers as it tends to indicate that the light source will be pleasing to the eye and provide accurate color recreation. In professional applications, for example, such as photography or film-making, light sources with a high CRI may be required to provide the necessary color reproduction quality. Traditional incandescent or halogen-based light sources have relatively high CRIs (e.g., greater than 98) because they tend to emit light energy at all wavelengths.

The color temperature of a light source is a measure that indicates the hue of the light source. A light source with a low color temperature generates more yellow and red hues and has a 'warmer' feel. In contrast, a light source with a higher color temperature generates more green and blue hues and has a 'colder' feel.

Depending upon the manufacturing methods, device configurations or customer requirements, different LED light engines may have different CRIs or color temperatures. When manufacturing white LED light engines, for example, depending upon the combination of LED components, the light emitted from the device may have a particular CRI and color temperature. In view of customer requirements, the devices are configured to have a particular CRI and color temperature.

For white light applications, it is possible to approximate a white light source in an LED light engine using two methods. First, a plurality of red, green and blue LEDs may be combined into a single device using an RGB mixing method. Second, in a separate method, a plurality of blue LEDs including a deposition of yellow phosphor may be combined into a single LED light engine using a blue phosphor method.

RGB white light LED light engines tend to be more efficient at generating light energy having a warmer color temperature. As a result, the correlated color temperature CCT of the devices tend to be below approximately 3000K. As a comparison, the CCT of an incandescent light is approximately 2700 K and the CCT of daylight is approximately 5500 K. The CRI of an RGB white light LED light engine, however, tends to be relatively low. In some cases, for example, the CRI of an RGB white light LED light engine is approximately 15. The relatively low CRI value for RGB white light LED light engines is generally attributable to the lack of yellow spectrum (see FIG. 2 illustrating the light output spectrum of an RGB white light LED light engine). Even with the addition of amber-color LED devices into the RGB LED light engine mix, the resulting RAGB mix of LED devices in the light engine does not completely fill the gap at the yellow range of the output light spectrum. As shown in FIG. 3, RAGB white light LED light engines only provide marginally improved performance over RGB devices in the yellow spectrum (approximately 570 nm to 590 nm). As a result, the CRI of an exemplary RAGB white light LED light engine is only improved over comparable RGB LED light engine devices by about 35 resulting in a CRI of approximately 50. The low CRI is unfortunate because even though RGB and RAGB LED light engines tend to have relatively low CRI performance, the light emitted from the devices is often considered pleasing to the eye.

The blue LED plus yellow phosphor method for LED light engine manufacture results in a white light LED light engine generating a cooler color temperature with CCT ranges from approximately 4000 Kelvin (K) to approximately 7000 K. In the devices, blue LEDs are coated with a phosphor material and integrated into a light engine. As the LEDs operate, some of the photons emitted by the LEDs strike the phosphor material and undergo a transformation. The transformation causes the photons to adopt a longer wavelength altering the color of the photon and the overall output color of the blue phosphor LED device. Depending upon the type of phosphor material and the amount deposited on each blue LED, the output color of the LED light engine can be controlled to generate a white light. Unfortunately, however, the blue phosphor LED light engine method does not result in a white LED light engine that is efficient at relatively warm color temperatures such as below approximately 3000 K. Even so, the CRI of a blue phosphor LED light engine is generally high due to the range of the spectrum emitted from phosphor. As shown in FIG. 4, for example, the output spectrum of a blue phosphor LED light engine is relatively broad and consistent. Unfortunately, again with reference to FIG. 4, the actual visual performance of the light engine does not correspond with its relatively high CRI score because the blue phosphor method does not provide a vivid color response at the green (500-550 nm) and red (610-650 nm) portions of the spectrum, resulting in an output color spectrum that is relatively cold and unappealing.

Although LED light engines incorporating a combination of red, green and blue LEDs tend to generate a white light that is visually pleasing, they also tend to score poorly on the CRI index. As a result, in commercial environments requiring light sources having a particular CRI, many RGB LED light engine devices do not have a sufficiently high CRI to be valid or competitive commercial products. In contrast, blue phosphor LED light engines do score relatively high on the CRI. Unfortunately, they generally output a visually unattractive cold-light spectrum. As discussed above, even though the blue phosphor devices score well, because the current CRI testing methodology is not designed to measure LED-based devices, it is possible for a device to score well while generating an unattractive or displeasing lighting spectrum.

To develop an LED light engine having a high CRI, high efficacy at warmer CCTs and also good visual performance, an LED light engine includes a combination of red, green and blue LEDs, where a portion of the blue LEDs are coated with a phosphor, or other phosphorescent materials.

In the present embodiment, multiple LEDs of various colors are combined into a single LED light engine to produce the desired output color temperature and CRI. The light engine includes a substrate. A plurality of LEDs are mounted to the substrate and electrically interconnected. The combination of LEDs mounted to the substrate includes x red LEDs, y green LEDs, and z blue LEDs, where the ratio x:y:z is selected to achieve a white light of a particular CCT. A phosphor material may be coated over a surface of one or more of the blue LEDs to modify the output light characteristics of the blue LEDs and the overall device to control the CRI and fine-tune the CCT of the light engine, for example by enhancing the light output of the LED light engine in the yellow spectrum having wavelengths of approximately 560 nm to 580 nm. In various configurations, the deposition percentage of phosphor material over each blue LED is managed to control the ratio of blue light versus converted yellow light emitted from each blue LED die. In one specific embodiment, the percentage composition of phosphor powder deposited within the silicon semiconductor material of each blue LED does not exceed 60%. In further embodiments, phosphor or other phosphorescent materials may also be partially covered over the blue LED dies.

In general, any number of LED colors may be used in any ratio to generate the desired CCT and CRI characteristics of the LED light engine. For example, a typical incandescent light bulb produces light with a CCT of approximately 2700 K (for example, warm white light), and a fluorescent bulb produces light with a CCT of approximately 5000 K. Thus, if the light characteristics of incandescent light bulbs are to be emulated, more red LEDs will typically be included within the LED light engine to achieve approximately 2700 K light. In some cases, to achieve a warm feel and CCTs below 2700 K, green LEDs are not included within the device. In another example, the LED light engine includes more blue LEDs with a lower phosphor concentration to achieve 5000 K light to emulate the light output characteristics of a fluorescent light bulb, for example. Depending upon system requirements, many LED dies having different wavelengths may be incorporated into the LED light engine in order to achieve a particular CRI or CCT. For example, a mixing ratio (with respect to the number of LEDs) of red LEDs (620 nm), green LEDs (525 nm) and blue LEDs coated with yellow phosphor (465 nm) of approximately 10:10:2 or 20:15:5 may be used in the LED light engine to achieve a light output of approximately 2800 K light. In accordance with another embodiment, red LEDs (620 nm), green LEDs (525 nm) and blue LEDs coated with yellow phosphor (465 nm) are mixed with a ratio of 10:10:3 or 15:15:5 to generate approximately 3900 K light. In yet another embodiment, a ratio of 10:10:4 or 10:10:5 is used in the LED light engine to achieve approximately 5000K light. It will be appreciated that the cited mix ratios are dependent on the intensity of the LED dies themselves, as well as their wavelengths.

FIG. 5 illustrates the light output spectrum of an LED light engine including a combination of red LEDs, green LEDs, and blue LEDs, where the blue LEDs are coated with a phosphor material. As shown in FIG. 5, the combination of blue LEDs with a phosphor material and other red and green LEDs results in a light output spectrum that includes the warmer color temperatures of an RGB LED light engine, with a boost in the yellow spectrum of wavelengths between approximately 560 nm to 580 nm resulting from the yellow spectrum emitted from the blue-phosphor LEDs. Therefore, using the blue LEDs and the phosphor material, the overall CRI of the LED light engine is improved by enhancing the light output of the device in the yellow spectrum having wavelengths of approximately 560 nm to 580 nm (the portion of the spectrum where RGB devices are deficient). In addition to the improved CRI, the LED light engine also generates a visually attractive light spectrum.

Figure 6B:
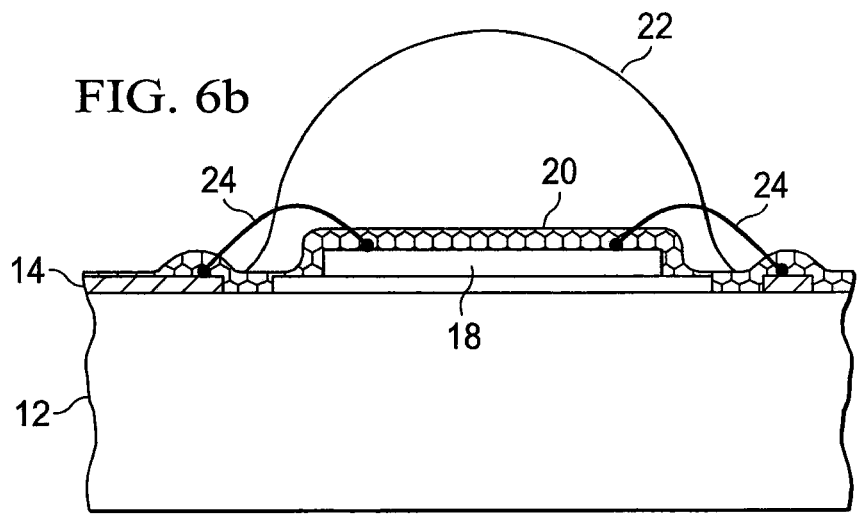

FIGS. 6a-6b illustrate an example LED light engine 10 integrating a plurality of red LEDs, green LEDs, and blue LEDs, where the blue LEDs are coated with a phosphorous or phosphorescent material. FIG. 6a shows a top-view of LED light engine 10, while FIG. 6b shows a cross-sectional view of one LED 18 within LED light engine 10. As shown on FIGS. 6a and 6b, LED light engine 10 includes a substrate or board 12 for supporting the plurality of LED devices. Substrate 12 may include a laminated metal substrate, such as a high thermal conductivity dielectric layer over which printed circuitry with mounting pads is formed. In general, substrate 12 includes a thermally conductive material. For example, substrate 12 may include a ceramic material such as aluminum nitride (AlN), aluminum oxide (Al2O3), metal enamel, a fiber glass board such as FR4, a metal clad dielectric board, or a diamond film material. Other suitable substrates include various hybrid ceramic substrates and porcelain enamel metal substrates. Furthermore, by optionally applying white masking on the substrate and silver-plating the circuitry, the light reflection from the substrate can be enhanced. The circuitry may also be plated with tin, silver, or nickel material to enhance light reflection. An additional fluorescent or phosphorous material may be deposited over a surface of substrate 12 or formed within substrate 12 to further emphasize the light output of LED light engine 10, promote even light spreading, and allow portions of substrate 12 to fluoresce. For example, as LEDs 18 generate light, the fluorescent or phosphorous material absorbs some of the photons generated by LEDs 18 and emits additional photons having a particular range of wavelengths. By adjusting the wavelength of the emitted light, the fluorescent or phosphorous material promotes light output and light spreading.

Conductive traces 14 are formed on a surface or within layers of substrate 12 using thick film screen printing, PVD, CVD, electrolytic plating, an electroless plating process, printed circuit board fabricating or other suitable metal deposition process. Traces 14 provide for electrical communication and interconnect each row of LEDs 18. Conductive traces 14 may also include mounting pads which form electrical interconnect pads for LEDs 18. Conductive traces 14 are made with an electrically conductive material, such as aluminum, copper, tin, nickel, gold, or silver, for example.

LEDs 18 are mounted as semiconductor devices or dies over a surface of substrate 12 using an appropriate surface mount technology. Depending upon the application, LEDs 18 may be mounted over a front and/or a back surface of substrate 12. LEDs 18 may be mounted to substrate 12 using a die attach adhesive or other die-mount material. To establish the electrical interconnects between LEDs 18, wirebonds 24 are formed between the contact pads of LEDs 18 and conductive traces 14. With reference to FIG. 6b, the contact pads of LEDs 18 are formed over a top surface of LEDs 18. In alternative embodiments, other surface mount technologies, including flip-chip mounting using solder ball bonds or electrically conductive epoxy bonds, are used to mount and electrically connect LEDs 18 to conductive traces 14.

Phosphor material 20 (shown on FIG. 6b) is coated over a surface of the blue LEDs 18 of LED light engine 10. Phosphor material 20 may include Yttrium Aluminum Garnet (YAG) base compounds, Silicate base compounds, Nitride base compounds, Terbium Aluminum Garnet (TAG) base compounds, Aluminate base compounds, and SiAlON-type phosphor materials. Alternatively, the blue LEDs may be coated with alkaline earth metal orthosilicate, other phosphor-group materials, or inorganic or organic phosphor materials. In a further alternative embodiment, the material includes divalent-europium-activated alkaline earth metal silicate. The phosphor materials are typically in powder form. The powder can be mixed into a transparent vehicle into a compound form, and then applied to fully or partially cover the LED die. The transparent vehicle may be silicone resin, epoxy resin, or other material. The application methods for the transparent vehicle include nozzle dispensing, screen printing, tape transferring, injection molding or spraying. As the light energy exits the LED, it passes through the coating and the phosphor material, where the transformation occurs.

FIG. 6a also illustrates the electrical interconnectivity of LEDs of LED light engine 10. A plurality of LED semiconductor devices 18 are surface mounted to substrate 12. A DC voltage is applied across terminals 16. The DC voltage is routed through metal conductors or traces 14 to supply operating potential to LED devices 18. LED devices 18 are alternatively interconnected with wire bonds, conductive adhesive bonds or solder bonds. LED devices 18 may be connected in electrical parallel configuration or electrical series configuration or combinations thereof. FIG. 6a illustrates 64 LED structures in electrical series, for illustration purposes. Moreover, LED devices 18 can be positioned in a rectilinear pattern, a circular or curvilinear pattern, a random or stochastic pattern, or any combination thereof. The LED devices can be laid out in multiple regions, where each of the regions exhibits different patterns and numbers of devices.

The number of LED devices 18 incorporated into the device may be selected in accordance with a number of design variables or considerations, such as type of power source, forward voltage ($V_f$) or power rating of each LED, and desired color combination. For example, LEDs 18 can be connected in series or parallel such that the overall combined $V_f$ of the LED devices matches the electrical input. By matching the combined forward voltage of the LEDs with the voltage of the input source, the power supply for the light engine can be simplified such that no bulky, complicated voltage step-up or step-down transformers, or switching power supplies which all have some degree of conversion losses, need be used in connection with the system. For example, the LEDs may be interconnected such that the forward voltage of the LED network matches the voltage of a rectified AC power supply such as a 120 VAC, 220 VAC, or 227 VAC power supply. In some cases, however, a constant current switching power supply may be provided as a power source. The constant current source enhances device integrity by minimizing the potential for thermal runaway that may otherwise result from the use of a constant-voltage power source.

An optional lens 22 or translucent protective structure is deposited over LEDs 18. Lens 22 may include a clear, frosty or translucent glass or plastic material and may have a ball, dome-shape, or other geometrical configuration.

Figure 7A:
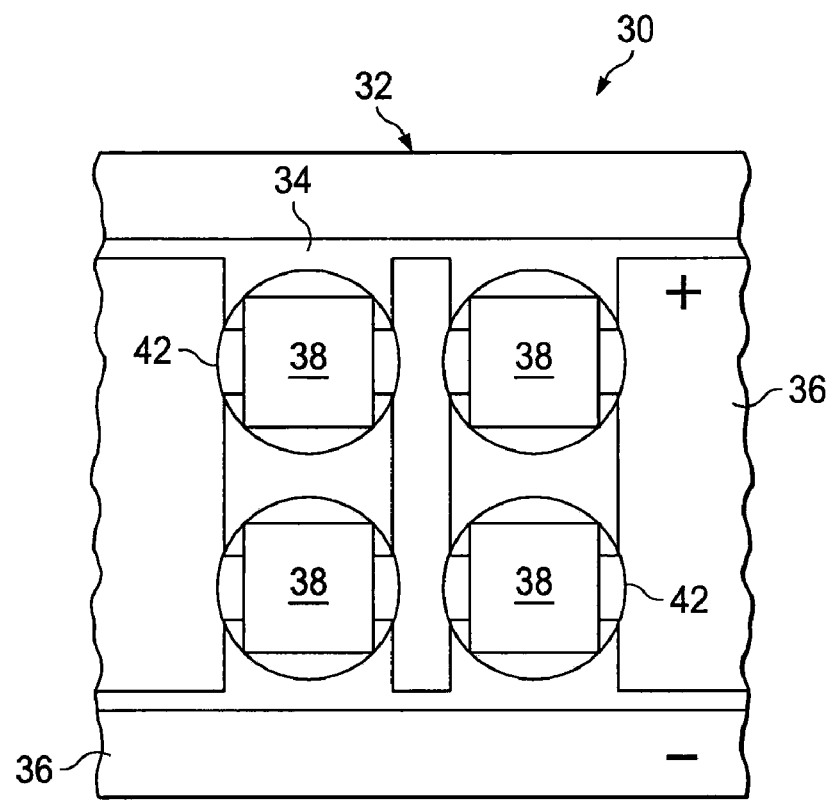
FIGS. 7a and 7b illustrate a substrate integrating a plurality of red LEDs, green LEDs, and blue LEDs, where the blue LEDs are covered with a phosphorous or phosphorescent coating compound, the LEDs have bottom contact pads and are electrically interconnected in a parallel and series configuration.
Figure 7B:
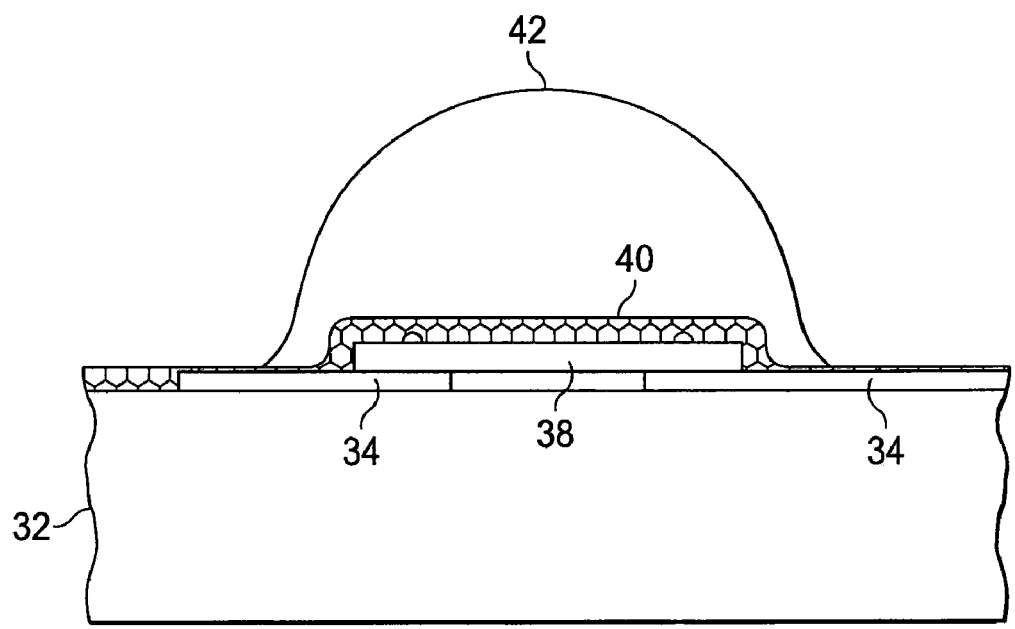

FIGS. 7a and 7b illustrate a substrate integrating a plurality of red LEDs, green LEDs, and blue LEDs, where the blue LEDs are covered with a phosphorous or phosphorescent coating compound. The LEDs have bottom contact pads and are electrically interconnected in a parallel and series configuration. FIG. 7a shows a top-view of a portion of LED light engine 30, while FIG. 7b shows a cross-sectional view of one LED 38 within LED light engine 30.

As shown on FIGS. 7a and 7b, LED light engine 30 includes a substrate or board 32 for supporting the plurality of LED devices. Conductive traces 34 are formed on a surface or within layers of substrate 32 using thick film screen printing, PVD, CVD, electrolytic plating, electroless plating, printed circuit board fabricating or other suitable metal deposition process. Traces 34 provide for electrical communication and interconnect each row of LEDs 38. Conductive traces 34 may also include mounting pads which form electrical interconnect pads for LEDs 38.

LEDs 38 are mounted as semiconductor devices or dies over substrate 32 to the mounting pads of conductive traces 34 using an appropriate surface mount technology. Depending upon the application, LEDs 38 may be mounted over a front and/or a back surface of substrate 32. LEDs 38 may be mounted to substrate 32 using a conductive die attach adhesive or other die-mount material. Contact pads formed over a bottom surface of LEDs 38 are electrically connected to the mounting pads of conductive traces 34 using a conductive adhesive, solder bumps, or other conductive material. In alternative embodiments, other surface mount technologies, including flip-chip mounting using solder ball bonds or electrically conductive epoxy bonds, are used to mount and electrically connect LEDs 38 to conductive traces 34.

Phosphor material 40 (shown on FIG. 7b) is coated over a surface of the blue LEDs 38 of LED light engine 30. Phosphor material 40 may be deposited over blue LEDs 38 using nozzle dispensing, screen printing, tape transferring, injection molding or spraying. As the light energy exits the LED, it passes through the coating and the phosphor material, where the transformation occurs.

FIG. 7a also illustrates an optional electrical interconnect network for the LEDs of LED light engine 30. A plurality of LED semiconductor devices 38 are surface mounted to substrate 32. A DC voltage is applied across terminals 36. The DC voltage is routed through metal conductors or traces 34 to supply operating potential to LED devices 38. LED devices 38 may be connected in electrical parallel configuration or electrical series configuration or combinations thereof. FIG. 7a illustrates LED structures in a parallel and series electrical network, for illustration purposes.

The number of LED devices 38 incorporated into the device may be selected in accordance with a number of design variables or considerations. For example, LEDs 38 can be connected in series or parallel such that the overall combined $V_f$ of the LED devices matches the electrical input.

An optional lens 42 or translucent protective structure is deposited over LEDs 38. Lens 42 may include a clear, frosty or translucent glass or plastic material and may have a ball, dome-shape, or other geometrical configuration.

Figure 8A:
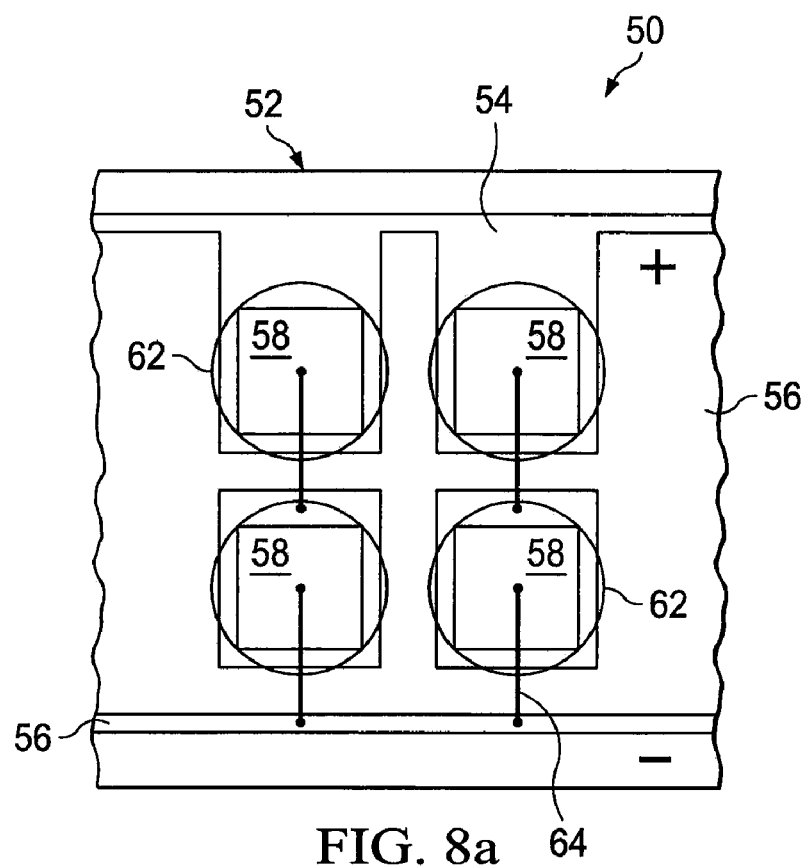
FIGS. 8a and 8b illustrate a substrate integrating a plurality of red LEDs, green LEDs, and blue LEDs, where the blue LEDs are covered with a phosphorous or phosphorescent coating compound, the LEDs have top and bottom contact pads and the LEDs are electrically interconnected in a parallel and series configuration.
Figure 8B:
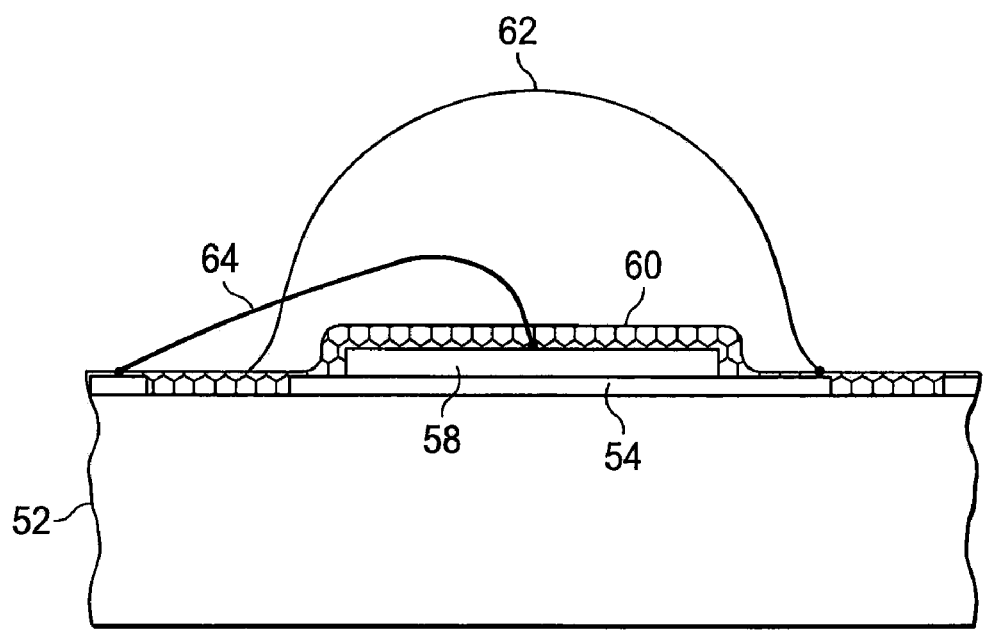

FIGS. 8a and 8b illustrate a substrate integrating a plurality of red LEDs, green LEDs, and blue LEDs, where the blue LEDs are covered with a phosphorous or phosphorescent coating compound. The LEDs have top and bottom contact pads and the LEDs are electrically interconnected in a parallel and series configuration. FIG. 8a shows a top-view of a portion of LED light engine 50, while FIG. 8b shows a cross-sectional view of one LED 58 within LED light engine 50.

As shown on FIGS. 8a and 8b, LED light engine 50 includes a substrate or board 52 for supporting the plurality of LED devices. Conductive traces 54 are formed on a surface or within layers of substrate 52 using thick film screen printing, PVD, CVD, electrolytic plating, electroless plating, printed circuit board fabricating or other suitable metal deposition processes. Traces 54 provide for electrical communication and interconnect each row of LEDs 58. Conductive traces 54 may also include mounting pads which form electrical interconnect pads for LEDs 58.

LEDs 58 are mounted as semiconductor devices or dies over substrate 52 to mounting pads of conductive traces 54 using an appropriate surface mount technology. Depending upon the application, LEDs 58 may be mounted over a front and/or a back surface of substrate 52. LEDs 58 may be mounted to substrate 52 using a conductive die attach adhesive or other die-mount material. A contact pad formed over a bottom surface of each LEDs 58 is electrically connected to the mounting pads of conductive traces 54 using a conductive adhesive, solder bumps, or other conductive material. Wirebonds 64 are connected between contact pads formed over a top surface of each LED 58 and conductive traces 54 to electrically interconnect LEDs 58. In alternative embodiments, other surface mount technologies, including flip-chip mounting using solder ball bonds or electrically conductive epoxy bonds, are used to mount and electrically connect LEDs 58 to conductive traces 54.

Phosphor material 60 (shown on FIG. 8b) is coated over a surface of the blue LEDs 58 of LED light engine 50. Phosphor material 60 may be deposited over blue LEDs 58 using nozzle dispensing, screen printing, tape transferring, injection molding or spraying. As the light energy exits the LED, it passes through the coating and the phosphor material, where the transformation occurs.

FIG. 8a also illustrates an optional electrical interconnect network for the LEDs of LED light engine 50. A plurality of LED semiconductor devices 58 are surface mounted to substrate 52. A DC voltage is applied across terminals 56. The DC voltage is routed through metal conductors or traces 54 to supply operating potential to LED devices 58. LED devices 58 may be connected in electrical parallel configuration or electrical series configuration or combinations thereof. FIG. 8a illustrates LED structures in a parallel and series electrical network, for illustration purposes.

The number of LED devices 58 incorporated into the device may be selected in accordance with a number of design variables or considerations. For example, LEDs 58 can be connected in series or parallel such that the overall combined $V_f$ of the LED devices matches the electrical input.

An optional lens 62 or translucent protective structure is deposited over LEDs 58. Lens 62 may include a clear, frosty or translucent glass or plastic material and may have a ball, dome-shape, or other geometrical configuration.

Any suitable class of LED devices may be used in connection with the present LED light engine, including discrete die, chip-scale packages, flip chip, conventional packages, surface mounted devices (SMD), or any other LED device now known or developed in the future. The LEDs may include semiconductor materials such as GaAsP, GaP, AlGaAs AlGaInP, and GaInN materials.

Figure 9A:
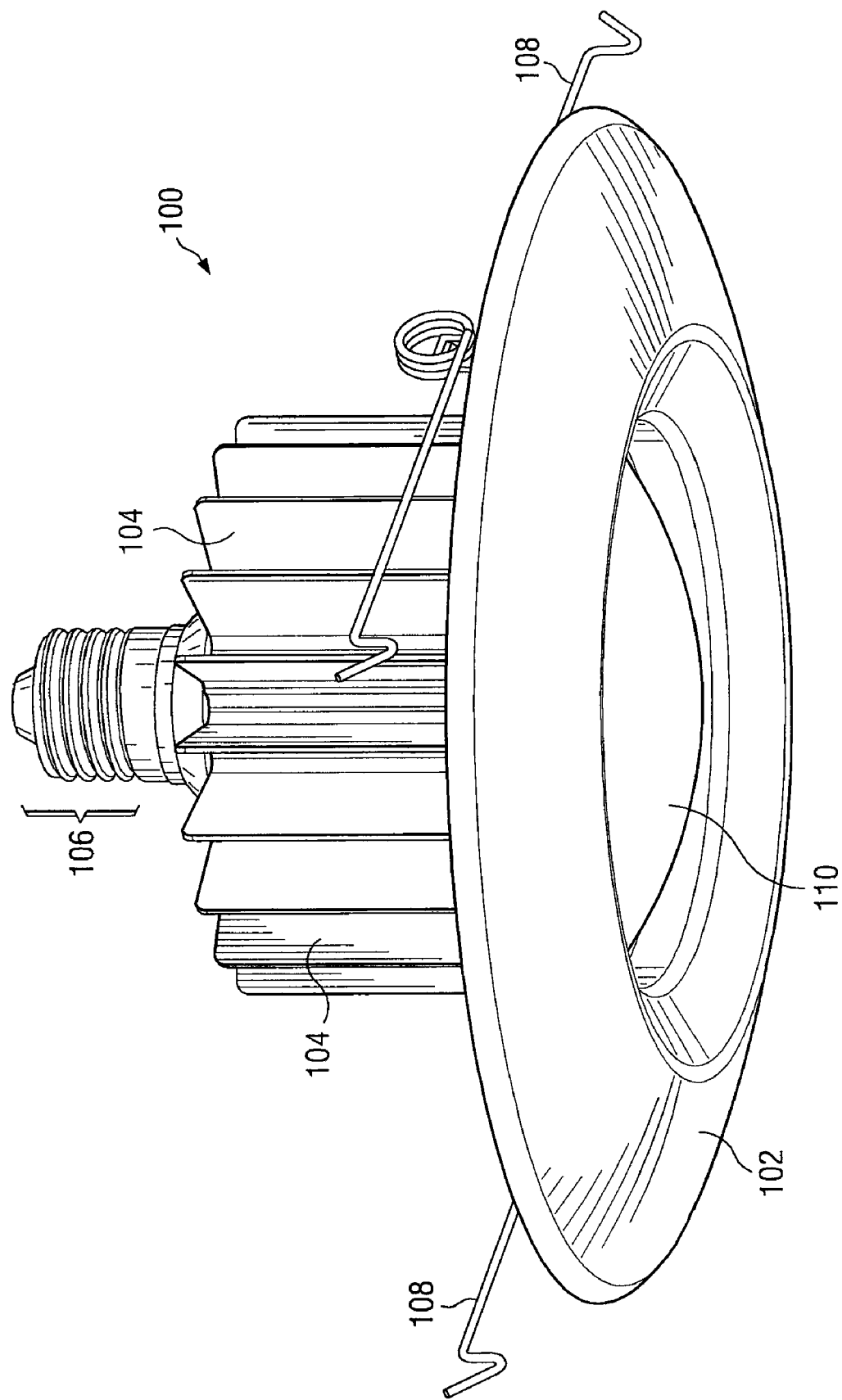
FIGS. 9a and 9b illustrate a light source including an LED light engine having red LEDs, green LEDs, and blue LEDs, where the blue LEDs are covered with a phosphorous or phosphorescent coating compound.
Figure 9B:
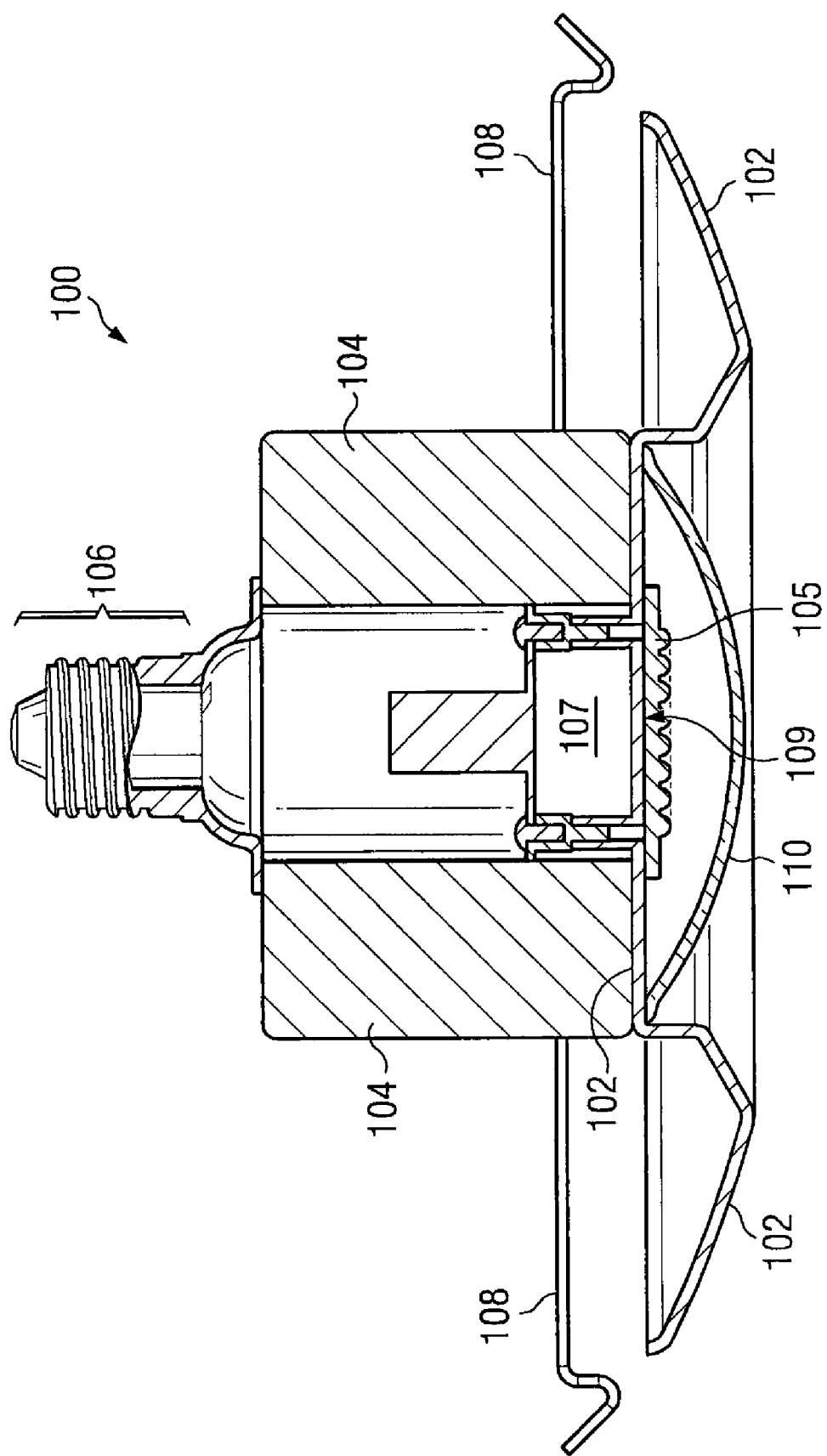

FIGS. 9a and 9b illustrate an example light source housing including an LED light engine having red LEDs, green LEDs, and blue LEDs, where the blue LEDs are coated with a phosphorous or phosphorescent material. FIG. 9a shows a perspective view of housing or light fixture 100, while FIG. 9b shows a cross-sectional view.

Housing 100 includes trim 102. Heatsink 104 is coupled to trim 102 to remove heat energy from trim 102, housing 100 and LED light engine 10. LED light engine 10 (shown on FIG. 9b) is connected to light engine mount point 109 on heatsink 104 and acts as the light source of the device. Housing 100 includes an electrical socket 106 for connecting LED light engine 10 to an electricity source. Socket 106 may include an E26/E27 bulb socket, leadwires or a GU24 socket. Depending upon the application, the electricity source may be a standard 120 VAC, 220 VAC, 277 VAC, or other AC source or a DC power source. If the power source is an AC power source and LED light engine 10 is configured to operate using a DC power source, an AC to DC converter circuit may be connected between socket 106 and LED light engine 10 to convert the AC power source into a DC source. In one embodiment, the conversion circuit includes circuit board 107 mounted within heatsink 104. Attachment clips 108 are connected to housing 100 and allow housing 100 to be mounted within a recessed can housing, for example.

In one embodiment, an optional optical envelope 110 is mounted to housing 100 over LED light engine 10 using a friction coupling, fastener, or other attachment mechanism. Optical envelope 110 may be clear or coated with one or more light-diffusing materials and may include a clear, frosty or translucent glass or plastic material. In one embodiment, the coating diffuses a spotlight formed by the LEDs of LED light engine 10 into a relatively smooth light source. Depending upon the application, the lens has a ball, dome-shape, or other geometrical configuration. The lens may be transparent, translucent, or frosty and may include polarizing filters, colored filters or additional lenses such as concave, convex, planar, "bubble", and Fresnel lenses. If the light source generates light having a plurality of distinct colors, the optical envelope may be configured to diffuse the light to provide sufficient color blending.

FIG. 10 illustrates method 200 for manufacturing an LED light source. Steps 202-206 illustrate a method for manufacturing the LED light engine to be integrated into the light source. In step 202 a substrate is provided for supporting the LED light engine. The substrate may include a metal clad printed circuit board, metal enamel board, AlN, Al2O3, or a fiber glass board material. In step 204, conductive traces are formed over the substrate. The conductive traces may be formed using a thick film screen printing, PVD, CVD, electrolytic plating, printed circuit board fabricating, or electroless plating process. In one embodiment, the conductive traces include a plurality of mounting pads. In step 206, LEDs are mounted to the substrate. In one embodiment, the LEDs are mounted to each of the mounting pads formed by the conductive traces using a die attach adhesive or a plurality of conductive solder bumps. The LEDs are electrically interconnected. The LEDs include red LEDs, green LEDs and blue LEDs. The blue LEDs may include a phosphor coating compound fully or partially covering each blue LED. The combination of red LEDs, green LEDs and blue LEDs are selected to achieve a target CCT and a target CRI for the LED light engine. Having manufactured the LED light engine in steps 202-206, the light engine is integrated into a light fixture housing. In step 208, the housing for the light source is provided. The light fixture housing includes a heatsink and a light engine mount point. The heatsink and the light engine mount point are in thermal communication. In step 210, the LED light engine is mounted to the light engine mount point of the housing.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of manufacturing a light emitting diode (LED) light engine, comprising:
    providing a substrate for supporting the LED light engine;
    forming conductive traces over the substrate using a film screen printing, physical vapor deposition (PVD), chemical vapor deposition (CVD), electrolytic plating, printed circuit board fabricating, or electroless plating process;
    mounting a plurality of red LEDs and a plurality of blue LEDS to the substrate with electrical connection to the conductive traces to provide the LED light engine consisting of red LEDs and blue LEDs;
    disposing a yellow phosphor coating compound over a portion of the substrate away from the blue LEDs and a portion of the blue LEDs constituting less than all of the blue LEDs, the concentration of the yellow phosphor coating compound being selected to allow emission of yellow spectrum light energy from the portion of the blue LEDs covered by the yellow phosphor coating compound; and
    combining emission of red spectrum light energy from the red LEDs and emission of blue spectrum light energy from a portion of the blue LEDs absent the yellow phosphor coating compound and the emission of yellow spectrum light energy from the blue LEDs covered by the yellow phosphor coating compound to produce a white light having a target correlated color temperature (CCT) in the range of 2700K to 5000K and a target color rendering index (CRI) for the LED light engine.

2. The method of claim 1, wherein the substrate includes aluminum nitride (AlN), aluminum oxide (Al2O3), a metal clad printed circuit board, metal enamel, or a fiber glass board material.

3. The method of claim 1, including:
    depositing white masking over the substrate of the LED light engine; and
    depositing silver, tin, or nickel over the conductive traces of the substrate of the LED light engine.

4. The method of claim 1, wherein the yellow phosphor coating compound includes Yttrium Aluminum Garnet (YAG) base compounds, Silicate base compounds, Nitride base compounds or Terbium Aluminum Garnet (TAG) base compounds.

5. The method of claim 1, including:
    providing a housing for the LED light engine, the housing including a heatsink and a light engine mount point, the heatsink and the light engine mount point being in thermal communication; and
    mounting the LED light engine to the light engine mount point of the housing.

6. The method of claim 1, wherein the concentration of the yellow phosphor coating compound is less than 60%.

7. A method of manufacturing a light emitting diode (LED) light engine, comprising:
    providing a substrate for supporting the LED light engine;
    forming conductive traces over the substrate;

mounting a plurality of red LEDs and a plurality of blue LEDS to the substrate with electrical connection to the conductive traces;

covering a portion of the substrate away from the blue LEDs with a phosphor coating compound;

covering a portion of the blue LEDs constituting less than all of the blue LEDs with the phosphor coating compound; and combining emission of light energy from the red LEDs and emission of light energy from a portion of the blue LEDs absent the phosphor coating compound and emission of light energy from the blue LEDs covered by the phosphor coating compound to produce a white light having a target correlated color temperature (CCT) and a target color rendering index (CRI) for the LED light engine.

8. The method of claim 7, wherein the substrate includes aluminum nitride (AlN), aluminum oxide (Al2O3), a metal clad printed circuit board, metal enamel, or a fiber glass board material.

9. The method of claim 7, wherein the phosphor coating compound includes Yttrium Aluminum Garnet (YAG) base compounds, Silicate base compounds, Nitride base compounds, or Terbium Aluminum Garnet (TAG) base compounds.

10. The method of claim 7, wherein the concentration of the phosphor coating compound is more than 60%.

11. The method of claim 7, including:
depositing white masking over the substrate of the LED light engine; and
depositing silver, tin, or nickel over the conductive traces of the substrate of the LED light engine.

12. The method of claim 7, wherein the conductive traces are formed using a thick film screen printing, physical vapor deposition (PVD), chemical vapor deposition (CVD), electrolytic plating, printed circuit board fabricating, or electroless plating process.

13. The method of claim 7, including:
providing a light fixture housing, the light fixture housing including a heatsink and a light engine mount point, the heatsink and the light engine mount point being in thermal communication; and
mounting the LED light engine to the light engine mount point of the light fixture housing.

14. A method of manufacturing a light emitting diode (LED) light engine, comprising:
providing a substrate for supporting the LED light engine;
mounting a plurality of red LEDs and a plurality of blue LEDS to the substrate;
covering a portion of the blue LEDs constituting less than all of the blue LEDs with a phosphor coating compound; and
combining emission of light energy from the red LEDs and emission of light energy from a portion of the blue LEDs absent the phosphor coating compound and emission of light energy from the blue LEDs covered by the phosphor coating compound to produce a white light having a target correlated color temperature (CCT) and a target color rendering index (CRI) for the LED light engine.

15. The method of claim 14, wherein the substrate includes aluminum nitride (AlN), aluminum oxide (Al2O3), a metal clad printed circuit board, metal enamel, or a fiber glass board material.

16. The method of claim 14, including depositing white masking over the substrate of the LED light engine.

17. The method of claim 14, wherein the phosphor coating compound includes Yttrium Aluminum Garnet (YAG) base compounds, Silicate base compounds, Nitride base compounds, or Terbium Aluminum Garnet (TAG) base compounds.

18. The method of claim 14, wherein the concentration of the phosphor coating compound is less than 60%.

19. The method of claim 14, including:
providing a housing for the LED light engine, the housing including a heatsink and a light engine mount point, the heatsink and the light engine mount point being in thermal communication; and
mounting the LED light engine to the light engine mount point of the housing.

20. A light emitting diode (LED) light engine, comprising:
a substrate for supporting the LED light engine; and
a plurality of red LEDs and a plurality of blue LEDs mounted to the substrate wherein a portion of the blue LEDs constituting less than all of the blue LEDs is covered with a phosphor coating compound so that a combination of emission of light energy from the red LEDs and emission of light energy from a portion of the blue LEDs absent the phosphor coating compound and emission of light energy from the portion of the blue LEDs covered by the phosphor coating compound produces a white light having a target correlated color temperature (CCT) and a target color rendering index (CRI) for the LED light engine.

21. The LED light engine of claim 20, wherein the substrate includes aluminum nitride (AlN), aluminum oxide (Al2O3), a metal clad printed circuit board, metal enamel, or a fiber glass board material.

22. The LED light engine of claim 20, wherein the phosphor coating compound includes Yttrium Aluminum Garnet (YAG) base compounds, Silicate base compounds, Nitride base compounds, or Terbium Aluminum Garnet (TAG) base compounds.

23. The LED light engine of claim 20, including a light fixture housing, the light fixture housing including a heatsink and a light engine mount point, the heatsink and the light engine mount point being in thermal communication, wherein the LED light engine is mounted to the light engine mount point of the light fixture housing.

24. The LED light engine of claim 20, wherein the concentration of the phosphor coating compound is more than 60%.

25. The LED light engine of claim 20, including white masking deposited over the substrate of the LED light engine.

26. A light emitting diode (LED) lamp, comprising:
a housing;
a substrate having conductive traces mounted within the housing;
a plurality of red LEDs and a plurality of blue LEDs coupled to the conductive traces; and
a phosphor coating disposed over a portion of the substrate and a portion of the blue LEDs constituting less than all of the blue LEDs so that a combination of emission of light energy from the red LEDs and emission of light energy from a portion of the blue LEDs absent the phosphor coating and emission of light energy from the portion of the blue LEDs covered by the phosphor coating produces a white light having a target correlated color temperature (CCT) and a target color rendering index (CRI).

27. The LED lamp of claim 26, wherein the substrate includes aluminum nitride (AlN), aluminum oxide (Al2O3), a metal clad printed circuit board, metal enamel, or a fiber glass board material.

28. The LED lamp of claim 26, wherein the phosphor coating includes Yttrium Aluminum Garnet (YAG) base compounds, Silicate base compounds, Nitride base compounds, or Terbium Aluminum Garnet (TAG) base compounds.

29. The LED lamp of claim 26, wherein the concentration of the phosphor coating is more than 60%.

30. The LED lamp of claim 27, wherein the phosphor coating includes a yellow phosphor coating.

31. The LED lamp of claim 27, further including a heatsink in thermal communication with the substrate.

32. The method of claim 7, wherein the phosphor coating compound includes a yellow phosphor coating compound.

33. The method of claim 14, wherein the phosphor coating compound includes a yellow phosphor coating compound.

34. The method of claim 14, further including disposing the phosphor coating compound over a portion of the substrate away from the blue LEDs.

35. The LED light engine of claim 20, wherein the phosphor coating compound includes a yellow phosphor coating compound.

* * * * *